United States Patent [19]

Mohrman

[11] 4,121,462
[45] Oct. 24, 1978

[54] TEMPERATURE INDICATING APPARATUS

[75] Inventor: Raymond F. Mohrman, St. Louis, Mo.

[73] Assignee: La Barge, Inc., St. Louis, Mo.

[21] Appl. No.: 656,427

[22] Filed: Feb. 9, 1976

[51] Int. Cl.² .............................................. G01K 7/16
[52] U.S. Cl. ............................................. 73/362 AR
[58] Field of Search ............ 73/362 AR; 340/166 EL

[56] References Cited

U.S. PATENT DOCUMENTS

| 3,783,604 | 1/1974 | Florent et al. ........................ 58/50 R |
| 3,786,485 | 1/1974 | Wojcik ...................... 340/166 EL X |
| 3,822,598 | 7/1974 | Brothers et al. ................. 73/362 AR |
| 3,824,581 | 7/1974 | Ohno ......................... 340/166 EL X |
| 3,877,307 | 4/1975 | Georgi ............................. 73/362 AR |
| 3,885,230 | 5/1975 | Merk ............................. 340/166 EL |

Primary Examiner—James J. Gill
Attorney, Agent, or Firm—Koenig, Senniger, Powers and Leavitt

[57] ABSTRACT

Temperature indicating apparatus having a sensor for introduction into a region having a temperature to be measured. Circuitry responsive to the sensor supplies an electrical signal representative of the temperature in the region. A display provides a visual indication of the temperature in the region and includes a plurality of temperature indicators each of which represents a discrete temperature level. Circuitry responsive to the electrical signal selectively illuminates at any one time only that indicator which corresponds to the temperature represented by the electrical signal at that time.

7 Claims, 9 Drawing Figures

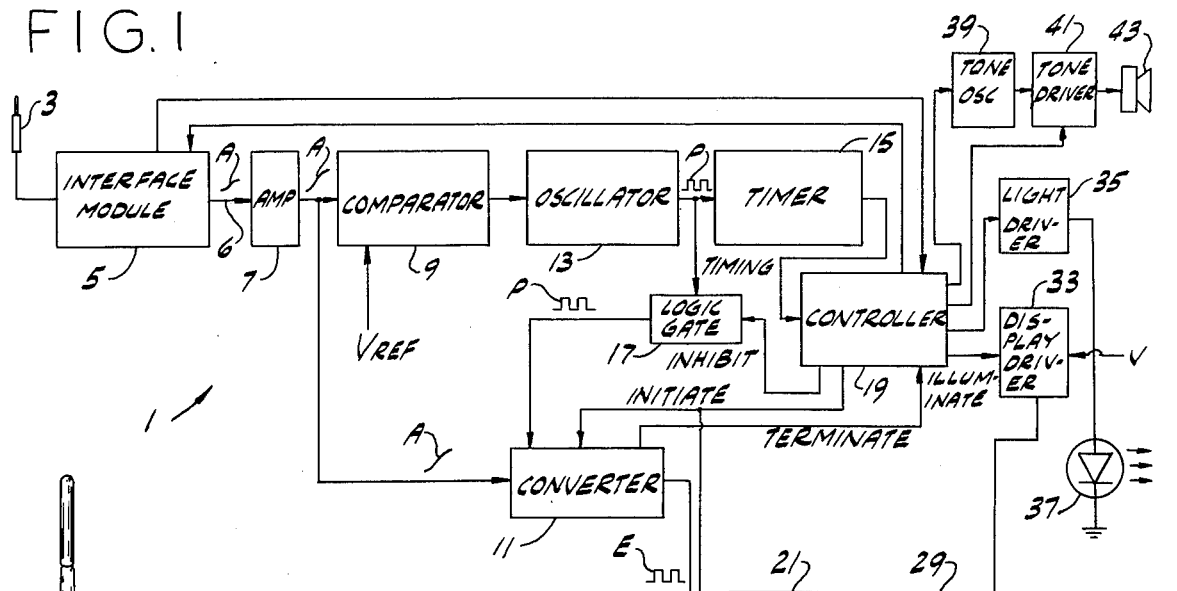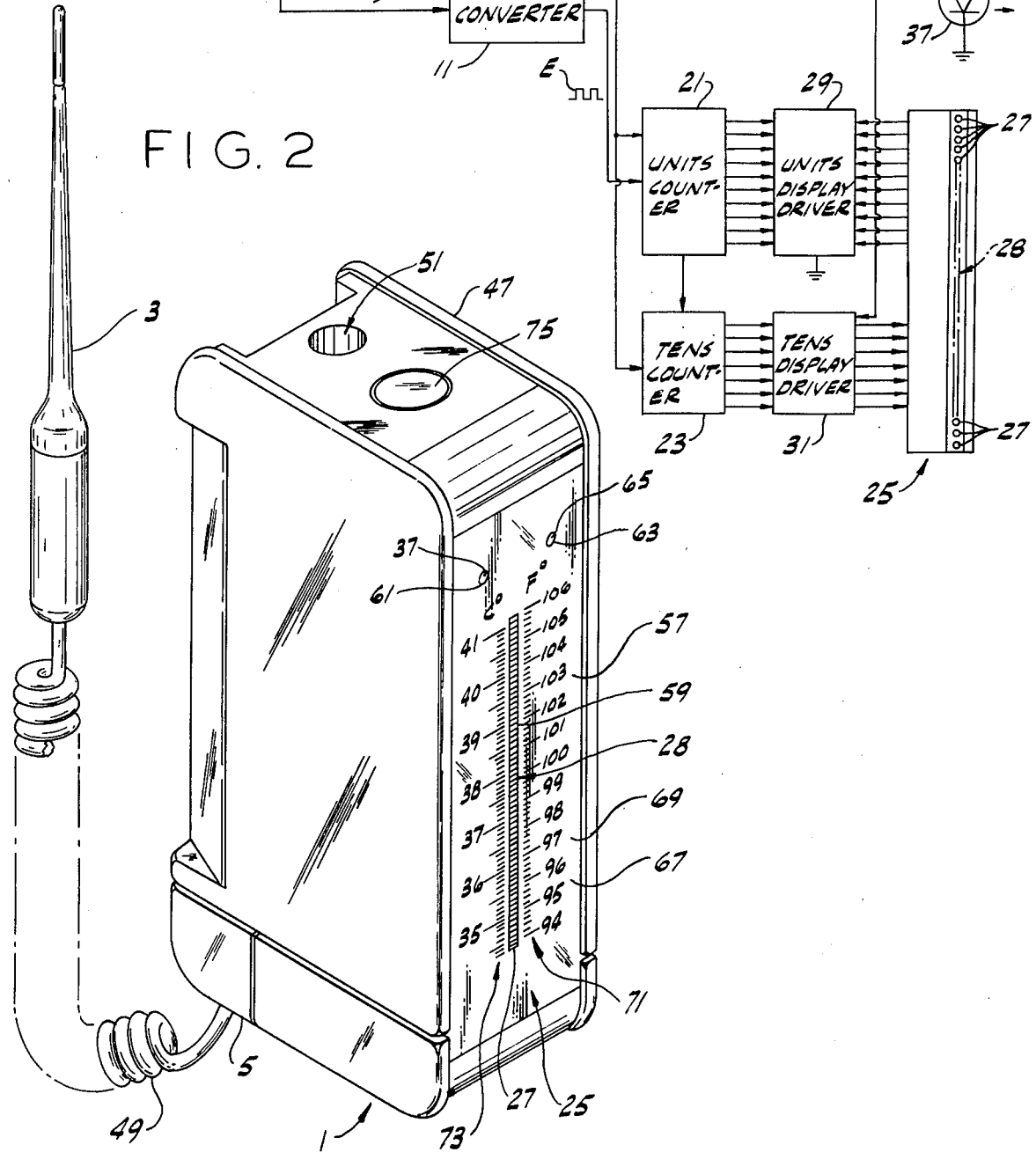

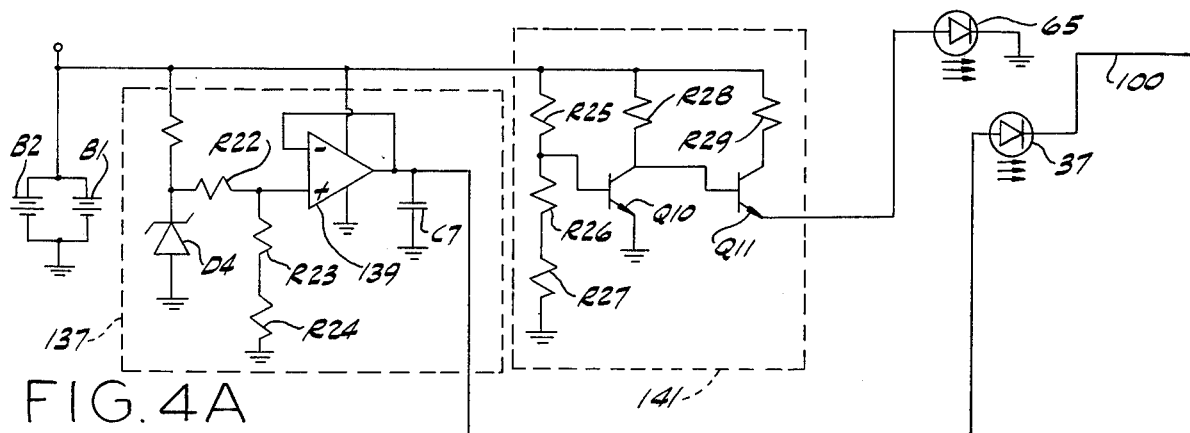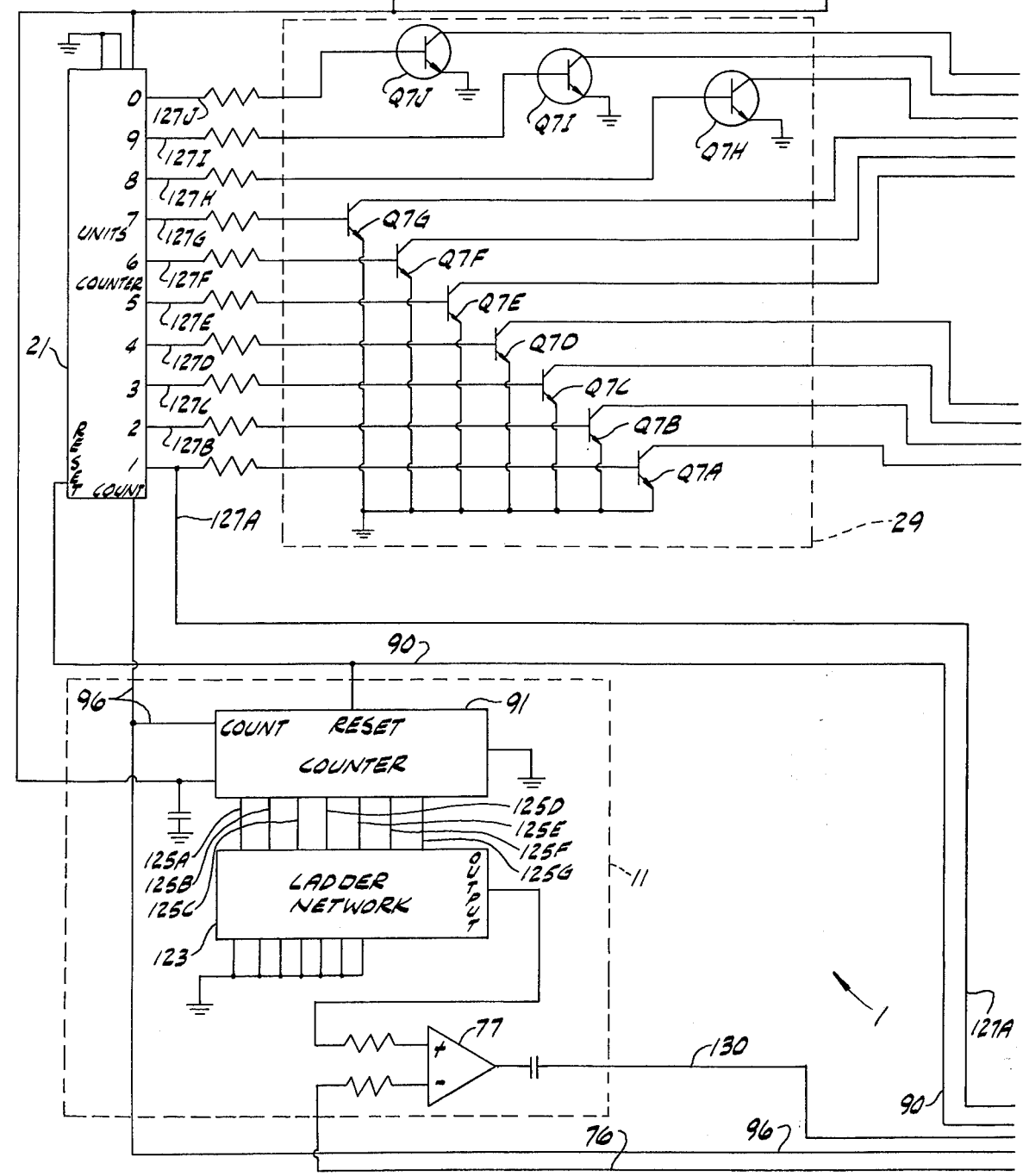
FIG. 4A

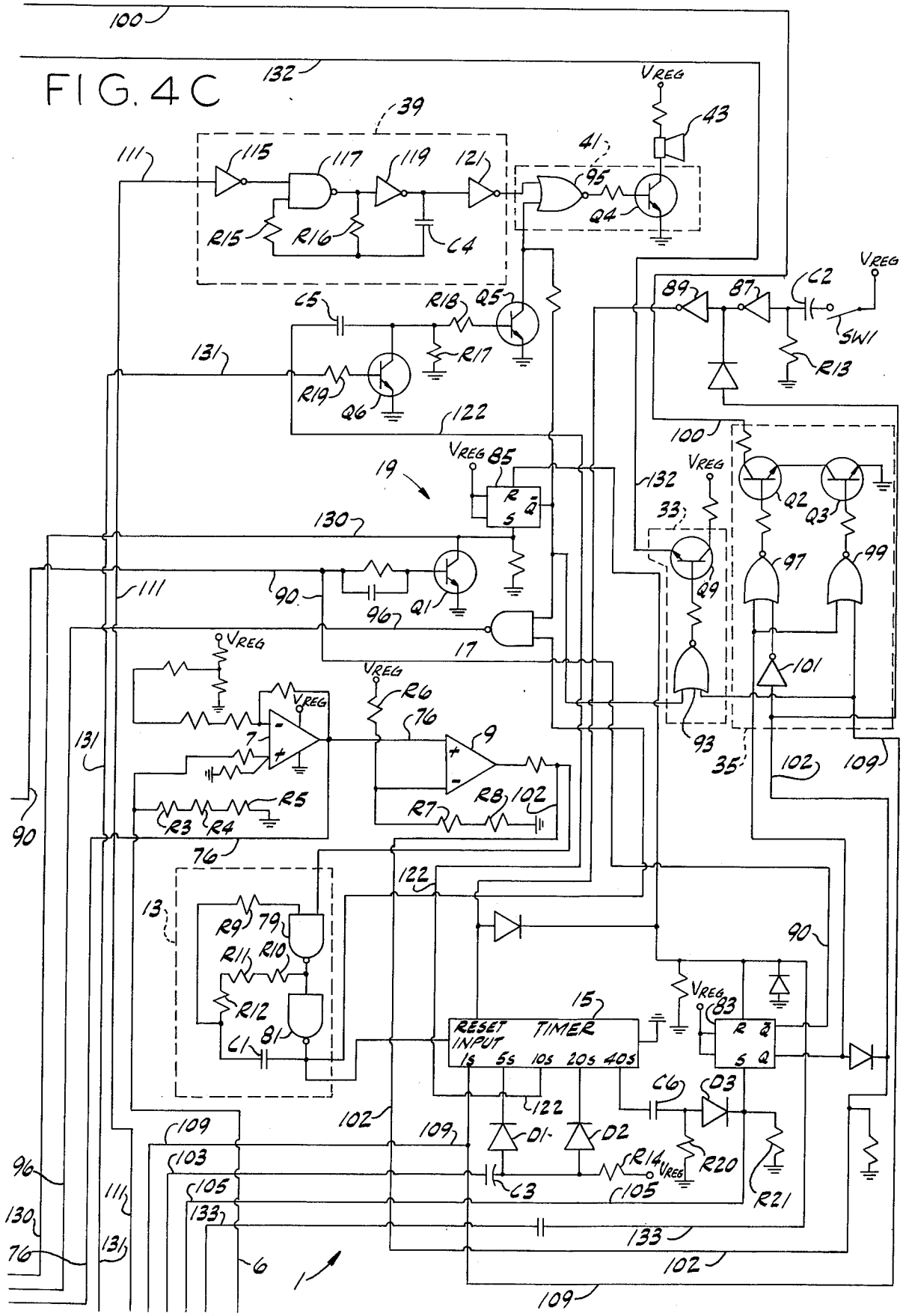

TEMPERATURE INDICATING APPARATUS

BACKGROUND OF THE INVENTION

This invention relates to temperature indicating apparatus and more particularly to portable probe-type electronic thermometers for clinical measurement of body temperature.

Such electronic thermometers have increasingly been used in hospitals and clinics, etc. These thermometers, which display the temperature being measured either by a digital indication or by an analog indication such as the position of a pointer on the face of a meter, have many advantages over glass-bulb thermometers which have a slow response, are difficult to effectively sterilize and have a high rate of breakage.

The existing electronic thermometers, however, are not without disadvantages. Some digital and analog readout electronic thermometers, for example, display a series of increasing preliminary temperature readings prior to displaying an accurate temperature of the zone being measured and this can mislead an incautious user into believing an erroneous preliminary temperature reading is the final correct reading.

The types of readouts typically employed with current instruments provide temperature displays which do not permit users to utilize interpretive or judgmental factors in evaluating the temperature data provided. Thus, in thermometers having digital displays the user is usually provided with a three or four digit readout which is the only information that can be read and recorded. If the display is partially inoperative, for example if one segment of a seven-segment light emitting diode display is not functioning, the temperature display may be incorrect, but the user has no way of determining this. Similarly, if the display is obscured as by dirt or fingerprints, etc. on the display cover, the user again may misread the temperature and have no way of knowing that she has done so. It is also possible for the user to simply misread the temperature indicated especially under the extremely busy conditions which are not uncommon in hospitals. In each of these situations, the reading may easily be more than one degree in error and thus significant. Further, small changes may occur in the instrument from one measurement to the next resulting in a digital display that differs from one reading to another even though a person's temperature is unchanged. Because the users can read only the temperature displayed, there is no way they can use their experience and other judgmental factors to interpret what is provided by the instrument. Digital type thermometers also provide a display that is either in ° F. or ° C. but not in both. If the temperature is read in one scale but needs to be recorded in the other, a temperature conversion is required which both consumes time and leads to error.

Electronic thermometers having analog displays do not have the last-mentioned disadvantage of digital display instruments. However, analog display instruments typically use a meter with a pointer and bearings therefor and thus are particularly susceptible to damage resulting from mechanical shock, as occurs if an instrument is dropped or otherwise mishandled, and from wear. This is also true of mechanical type digital display thermometers. Again, reading errors may occur because of misreading of the display either because of damage to the instrument, obscuring of the display or human error.

Other disadvantages with present electronic thermometers include general susceptibility to damage when dropped or otherwise mishandled. In such cases, the thermometer may become either partially or wholly inoperable and the accuracy of the readout becomes unreliable or questionable.

Some of the prior electronic thermometers have a provision for displaying a series of sequential digits to establish a given time period, e.g., 20 seconds during the time between the introduction of the probe into the region and the time the correct temperature thereof can first be accurately displayed. While this is a useful feature, the user counting the patient's pulse beats can be confused by the series of digits displayed at one second increments which can lead to reporting an erroneous pulse. Additionally, the temperature display of many existing electronic thermometers cannot be read under adverse conditions as, for example, when a patient is kept in a darkened room. Also, there are problems of pilferage, particularly where the instrument is "pocket sized", and the batteries of existing electronic thermometers must be frequently replaced generally because they are subject to a high battery drain when in use.

Representative patents which are of interest in the same general field as that of the present invention, include U.S. Pat. Nos. 3,702,076, 3,822,598 and 3,906,797.

SUMMARY OF THE INVENTION

Among the several objects of this invention may be noted the provision of apparatus which visually indicates a temperature to be measured by a display having advantages of both analog and digital readouts but without the disadvantages of such readout presentations; the provision of temperature indicating apparatus which will automatically display the temperature measured and no other temperatures; the provision of such apparatus which presents users with a temperature indication that may be interpreted by them in light of their knowledge, expertise and other judgmental factors to more accurately and reliably ascertain the temperature in a region; the provision of such apparatus in which a temperature indication is readily directly determinable in both degrees Fahrenheit and Centigrade; the provision of such apparatus which reliably informs the user when to read the temperature display; the provision of such apparatus for use in taking a person's temperature and for giving an audible indication to the user to assist in the taking of the person's pulse while their temperature is being taken; the provision of such apparatus in which a temperature indication is easily read even when the apparatus is used in darkened areas; the provision of such apparatus which is rugged in construction so as to continue to provide reliable temperature indications despite being dropped or mishandled; the provision of such apparatus which is of a size that discourages pilferage while not being inconvenient to use; the provision of such apparatus in which battery drain is minimized and battery life prolonged; and the provision of such apparatus which is economical in cost and easy to operate; repair and maintain.

Briefly, a temperature indicating apparatus of the invention comprises means for sensing the temperature in a region having a temperature to be measured. Means responsive to the sensing means supply an electrical signal representative of the temperature in the region. Display means, which provide a visual indication of the temperature in the region, include a plurality of temperature indicators each of which represents a discrete temperature level. Means responsive to the electrical signal selectively illuminate at any one time only that indicator which corresponds to the temperature represented by the electrical signal at that time. Other objects and features will be in part apparent and in part pointed out hereinafter.

BRIEF DESCRIPTION OF THE DRAWINGS

FIG. 1 is a block diagram of temperature indicating apparatus of the invention;

FIG. 2 is a perspective view of a portable electronic thermometer embodying temperature indicating apparatus of the invention;

FIGS. 4A, 4B and 4C are schematic circuit diagrams of temperature indicating apparatus of the invention.

Corresponding reference characters indicate corresponding parts throughout the several views of the drawings.

DESCRIPTION OF A PREFERRED EMBODIMENT

Figure 3:
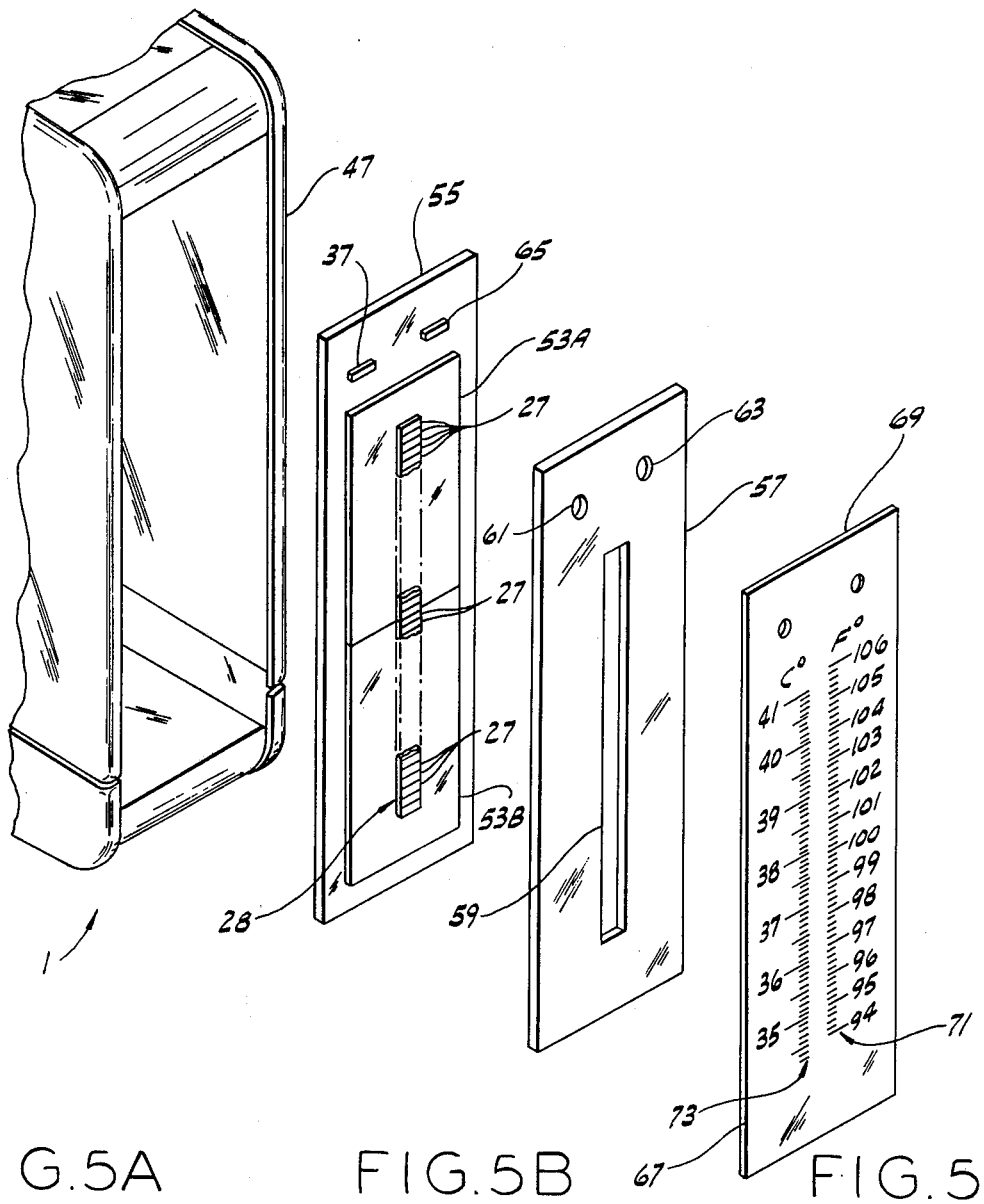
FIG. 3 is an exploded view of the temperature display of the electronic thermometer shown in FIG. 2.

Referring now to the drawings, temperature indicating apparatus of the present invention is indicated generally at 1 and is shown in block diagram form in FIG. 1. A temperature sensing probe 3 is introduced into a region to sense the temperature therein, and an interface module 5 supplies an analog signal A at 6 whose amplitude is a function of the temperature sensed by probe 3. Analog signal A from interface module 5 is preferably amplified by an amplifier 7 and supplied both to a comparator 9 and to an analog-to-digital converter 11. A second input to comparator 9 is a reference level or voltage the amplitude of which represents a preselected temperature level. When the amplitude of the analog signal A reaches the reference level, comparator 9 actuates an oscillator 13 causing pulses P to be supplied at a predetermined rate to a binary counter or timer 15 and, through a logic gate 17, to converter 11. The actuation of oscillator 13 initiates a predetermined timing interval during which the temperature sensed by probe 3 approaches the temperature in the region. Timer 15 responds to pulses P from oscillator 13 to count from zero to a preselected value and the predetermined timing interval is equal to the time required by timer 15 to count from zero to the preselected value. The preselected value to which counter 15 counts may be one of a plurality of values, the particular value being determined by interconnections between interface module 5 and a controller 19.

At completion of a predetermined timing interval, timer 15 supplies a timing signal to controller 19. Controller 19 responds to this signal by supplying an initiate signal to converter 11 to initiate the conversion of the analog signal supplied by amplifier 7 to an electrical signal representing the temperature in the region which is a digital signal E. Elements of the digital signal are pulses provided by oscillator 13 and the digital signal from converter 11 is supplied to a units counter 21. Counter 21 counts the elements of digital signal E and for each ten counted supplies a signal to a tens counter 23. When the conversion process is complete, converter 11 supplies a terminate signal to controller 19 which then inhibits logic gate 17 stopping the supply of timing pulses to converter 11. Digital signal E thus has as signal elements the number of pulses P supplied to converter 11 between the time controller 19 supplies an initiate signal to converter 11 and the time converter 11 supplies a terminate signal to controller 19.

A temperature display 25 provides a visual indication of the temperature in the region. Display 25 includes a plurality of temperature indicators 27 each of which represents a discrete temperature level. Temperature indicators 27, which are preferably light-emitting diodes (LED's), are arranged to form a linear array 28 in which only the indicator 27 corresponding to the temperature in the region at any one time, as represented by digital signal E from converter 11, is selectively illuminated. Which indicator 27 is illuminated is determined by the number of elements of the electrical signal counted by counters 21 and 23. A units indicator display driver 29 and a tens indicator display driver 31 each have one of a plurality of control lines actuated in response to the total number of signal elements counted by counters 21 and 23. Further, controller 19, in response to the terminate signal from converter 11, supplies an illumination signal to a display driver 33. Driver 33, in response to this illumination signal, supplies a voltage through driver 31, the selected temperature indicator 27 and driver 29 to ground thereby causing illumination of the selected indicator and providing a visual indication of the temperature in the region.

During the predetermined timing interval, controller 19 actuates a light driver 35, turning on a temperature processing light 37 and providing a visual indication that a temperature measurement is in progress. When a temperature indicator 27 is illuminated, controller 19 actuates a tone oscillator 39 and a tone driver 41 to provide an audible indication, via a speaker 43, that a temperature is being displayed.

Referring to FIG. 2, an electronic thermometer embodying the above described temperature indicating apparatus 1 is illustrated. Thermometer 1 may be used for oral, rectal or axillary measurement of a person's body temperature and includes a portable, hand-held unit 47. Unit 47, which has a housing that may be molded of a suitable synthetic resin material capable of withstanding rugged use, encloses circuitry of temperature indicating apparatus 1 and includes batteries B which supply electrical power to thermometer 1. Interface module 5 is detachably connected to unit 47 at the bottom rear of the unit by a suitable electrical connector, in order to permit removal and replacement of module 5, and may be one of three different types, each being specially wired for taking temperatures in one of the aforementioned ways. Temperature probe 3 is connected to module 5 by a coiled cable 49. Unit 47 has a receptacle 51 for holding or storing probe 3 when not in use. A switch is preferably provided in receptacle 51 so that removal of probe 3 from its stored position actuates the switch to energize the thermometer circuitry for operation. When probe 3 is stored, the switch is deactuated and no power is applied to the circuits. This lengthens the useful life of the batteries in unit 47 and also simplifies thermometer 1 operation by eliminating manually operated power switches.

Temperature display 25 of thermometer 1 includes a sufficient number of temperature indicators 27, for example sixty-seven, to permit any temperature within the usual range of human body temperatures to be accurately indicated in degrees Fahrenheit or Centigrade. As shown in FIG. 3, linear array 28 of light emitting diodes 27 is formed on two circuit chips 53A and 53B which are mounted or positioned on a printed wiring board 55 or other suitable support so that linear array 28 forms a column of light sources. After chips 53A and 53B are attached to board 55, it is installed in unit 47 and interconnections between the board and other circuitry of temperature indicating apparatus 1 are made.

A faceplate 57 is installed in unit 47 and covers printed wiring board 55. Faceplate 57 has an elongate slot or viewing aperture 59 through which temperature indicators 27 may be observed by the user of thermometer 1. Further, faceplate 57 has a viewing aperture 61 for temperature-in-process light 37 and a viewing aperture 63 for a battery replacement signal light 65. Both temperature-in-process light 37 and replace-battery light 65 are light-emitting diodes and both are mounted on printed wiring board 55.

A transparent lens 67, mounted in unit 47, covers faceplate 57. On inner surface 69 of lens 67 there is inscribed, by silk screening or a similar process, first and second temperature scales 71 and 73. Temperature scale 71 provides a visual indication of the discrete temperature level represented by each temperature indicator 27 in degrees Fahrenheit, while scale 73 provides a similar visual indication in degrees Centigrade. Temperature scale 71 may, for example, provide for a range of temperatures of between 94° F. and 106° F. in 0.2° F. increments, while scale 73 may provide for a range of temperatures of between 34.4° C. and 41° C. in 0.1° C. increments. This dual scale readout feature is advantageous in eliminating temperature conversion calculations which are both time-consuming and lead to errors. A pushbutton switch 75 is located atop thermometer 1 and when depressed energizes a circuit for providing back-lighting for temperature display 25. Thus, even though thermometer 1 is used in a darkened room, temperature scales 71 and 73 may be illuminated to facilitate temperature readings.

Figure 4B:
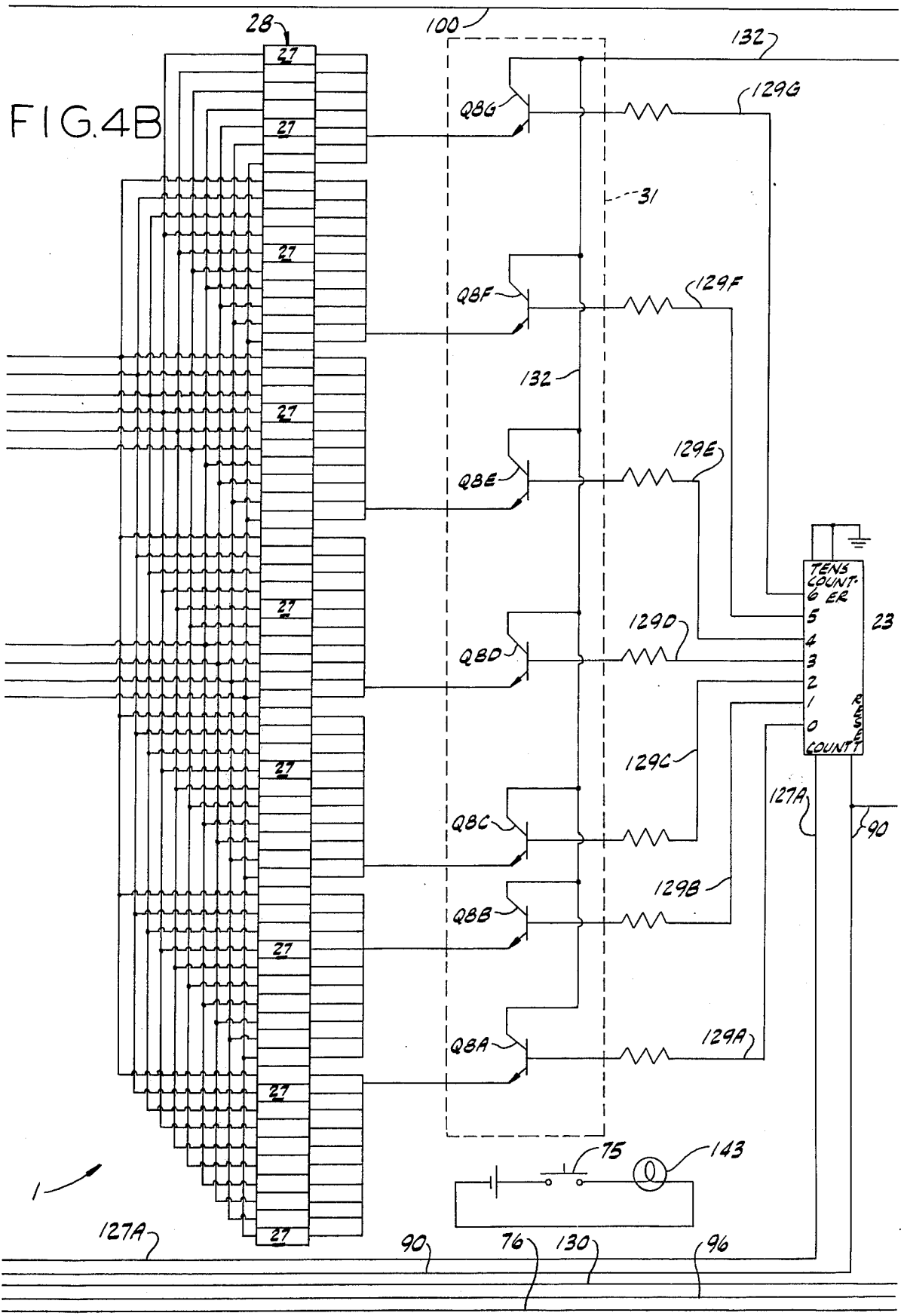

Operation of temperature indicating apparatus 1 is described with reference to FIGS. 4 and 5. As shown in FIGS. 5A, 5B and 5C, probe 3 includes a temperature sensitive impedance element or thermistor T whose impedance varies as a function of the temperature in the region into which probe 3 is introduced. Thermistor T is positioned in series with a pair of precision resistors R1 and R2 and, if temperatures are to be taken orally, with a Sensistor S whose temperature-sensitive impedance is used to compensate for the effect of the gross probe temperature. Sensistor S is included in the interface module 5, shown in FIG. 5A. The resultant impedance combination forms one portion of a voltage divider network, the other portion of which includes the resistors R3, R4 and R5 shown in FIG. 4C. When voltage from a regulated supply, $V_{reg}$, is impressed on this network, an analog voltage is produced on line 6 whose amplitude is a function of the temperature in a region sensed by probe 3. This voltage, the amplitude of which may vary, for example, from 1.05 to 1.60 volts, is supplied to amplifier 7 whose gain is approximately ten.

Figure 5A:
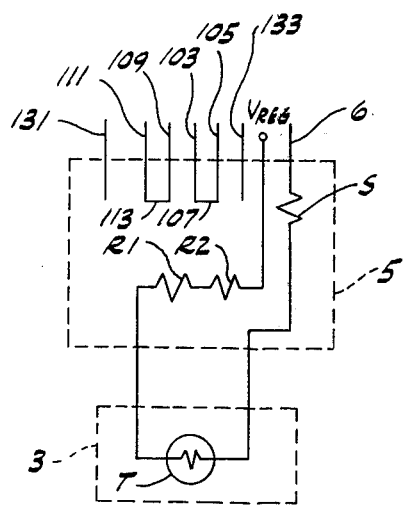
FIGS. 5A, 5B and 5C are schematic circuit diagrams of temperature probes and interface units for use in taking the temperature of a person either orally, rectally or axillarily.
Figure 5B:
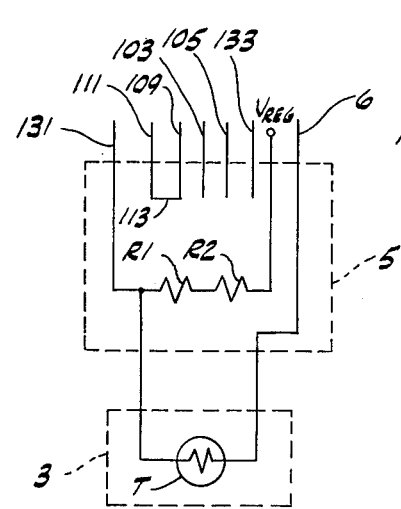
Figure 5C:
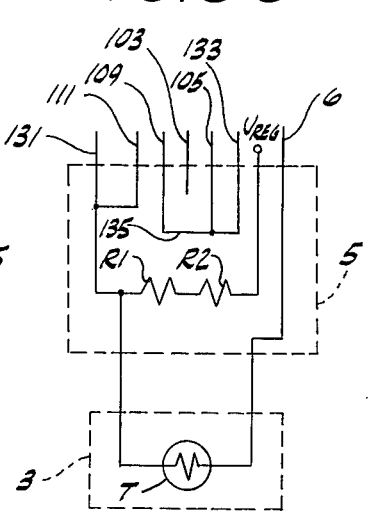

The gain of amplifier 7 is determined in part by the resistance value of precision resistors R1 and R2, which for the interface module 5 shown in FIG. 5A may be, for example, a total of 200 ohms, while for the module 5 shown in FIGS. 5B and 5C may be, for example, a total of 2400 ohms. The effect of the different resistance values results in an output signal from amplifier 7 on line 76 which, in the oral mode of operation, is equivalent to a corresponding temperature value that is, for example 1.1° F. higher than that actually being sensed by probe 3. This offset ultimately permits an orally taken temperature to be indicated which corresponds to the actual temperature of the patient but which is attained before the actual temperature of probe 3 reaches that level and thus in less time than would otherwise be required if temperature indicating apparatus 1 did not have this anticipation feature. No such temperature anticipation is normally necessary when thermometer 1 is used in the rectal or continuous modes and therefore the gain of amplifier 7 in these modes is such that the output signal on line 76 includes no temperature offset. The output voltage of amplifier 7 on line 76 is supplied to comparator 9 and to one input of a comparator 77 (FIG. 4A) which is included in converter 11. The other input to comparator 9 is a reference voltage level developed by applying regulated voltage across a voltage divider network having resistors R6, R7 and R8. This reference voltage level, which is approximately three-hundred seventy millivolts may, for example, represent a temperature level of 94° F. or 34.4° C.

When probe 3 is first introduced into the region of the body at which the temperature is to be measured, the temperature sensed by probe 3 is below 94° F. and the output of comparator 9 is a logic low which inhibits a NAND gate 79 of oscillator 13 (FIG. 4C). With gate 79 inhibited, oscillator 13 supplies no pulses. As soon as the temperature sensed by probe 3 reaches 94° F. and the input to comparator 9 from amplifier 7 is a voltage whose amplitude equals that of the reference level or voltage amplitude, the logic output of comparator 9 to gate 79 goes high actuating oscillator 13. Oscillator 13, which also includes a NAND gate 81, resistors R9, R10, R11 and R12 and a capacitor C1, is a conventional oscillator circuit which, for example, supplies pulses at a rate of approximately 205 Hz to the clock input of timer 15 and to one input of logic gate 17 which is a NAND gate.

The predetermined timing interval during which the temperature sensed by probe 3 approaches the temperature in the region is determined by the type of interface module 5 used with thermometer 1. Each module includes means for establishing a different, unique predetermined timing interval which is thereby changed by replacing one interface module with another module. As previously noted, the type of module 5 used depends upon whether a patient's temperature is being taken orally, rectally, or axillarily. The use of interface module 5, shown in FIG. 5A, when a patient's temperature is taken orally results in a predetermined timing interval of 25 seconds. The use of interface module 5 shown in FIG. 5B, when a patient's temperature is taken rectally, results in a predetermined timing interval of 40 seconds; while the use of the interface module 5 shown in FIG. 5C, when a temperature is taken axillarily, results in an interval of only one second and in this mode the temperature is repetitively measured and displayed. Further, the interface module 5, shown in FIG. 5C, may also be used for oral or rectal temperature measurements.

Controller 19 includes a pair of flip-flops 83 and 85 which are reset upon removal of probe 3 from receptacle 51. A reset pulse is created upon closure of a switch SW1 (FIG. 4C) positioned in receptacle 51 and held open by probe 3 when stored. Closure of switch SW1 causes voltage to be supplied to an inverter 87 for a period determined by the time constant of a capacitor C2 and a resistor R13, which period is approximately one-half second. The result is a momentary logic high at the output of a second inverter 89 which is supplied to the reset inputs of timer 15 and flip-flops 83 and 85.

With flip-flop 83 reset, its Q output is a logic high which is supplied on line 90 to the base of an NPN transistor Q1 and to the reset input of units counter 21 (FIG. 4A), tens counter 23 (FIG. 4B) and a binary counter 91 (FIG. 4A) which is included in converter 11. With the Q output of flip-flop 83 high, each of these counting circuits is reset and inhibited from responding to any input signals. Further, transistor Q1 is actuated by the logic high at its base which causes the set input of flip-flop 85 to be grounded and prevents erroneous temperature indications. With flip-flop 85 reset, its Q output is a logic high supplied to a second input of logic gate 17 and to one input of a NOR gate 93 in display driver 33 and a NOR gate 95 in tone driver 41. With a high input to gate 17 from flip-flop 85, pulses from oscillator 13 are supplied to the clock input of counter 91 via line 96 and the count input of units counter 21. As noted, however, so long as the Q output of flip-flop 83 is high, these circuits do not respond to the pulses.

After reset, the Q output of flip-flop 83 is a logic low which is supplied to one input of a pair of NOR gates 97 and 99 both of which are included in light driver 35. Further, the logic low output is inverted by an inverter 101 and supplied as a logic high to the other input of gate 97. The other input to gate 99 is a logic low supplied by timer 15 at a one-second output of the timer and with both inputs to gate 99 low its output is high. The logic output of gates 97 and 99 are respectively supplied to the base of NPN transistors Q2 and Q3 which, when conducting, provide a ground via line 100 for temperature processing light 37. When the logic output of comparator 9 goes high, it makes the input to inverter 101 high via line 102 and its logic output low. Both inputs to gate 97 are thus low, causing its output to go high and actuating transistor Q2. Since gate 99 already has a high output, transistor Q3 is already on and temperature processing light 37 is therefore illuminated. Because one input to gate 99 is supplied by the one-second output of timer 15, it is only intermittently low, and consequently process light 37 flashes on and off.

The following discussion refers to temperature indicating apparatus 1 in the oral mode of operation. Rectal and continuous mode operations will be discussed hereinafter and differences between the modes will be pointed out at that time.

When a predetermined timing interval is initiated, timing pulses are supplied to a clock input of timer 15. If an oral temperature is being taken, a 25 second line 103 is connected to a time select line 105 by a jumper wire 107 located in interface module 5 shown in FIG. 5A. Time select line 105 is connected to the set input of flip-flop 83. Further, the one-second output of timer 15, supplied on line 109, is connected to a tone control line 111 by a jumper 113 also located in interface module 5. Regulated voltage is supplied to 25 second line 103 through a resistor R14 and a capacitor C3. A diode D1 connects line 103 to a 5-second output of timer 15 and a diode D2 connects line 103 to a 20-second output of timer 15. With timer 15 reset, both these outputs of timer 15 are logic lows and line 103 is grounded through the timer. With line 103 grounded, the set input of flip-flop 83 is also grounded. When a voltage is applied to this input to set the flip-flop, it signifies that the predetermined timing interval is complete and the conversion process, which culminates in a diode 27 in array 28 being illuminated, is commenced.

The logic output of timer 15 on line 109 goes momentarily high every second after initiation of the predetermined timing interval. Via jumper 113, this logic level is supplied on line 111 to the input of an inverter 115 located in tone oscillator 39. Oscillator 39 (FIG. 4C), which further includes a NAND gate 117, inverters 119 and 121, a capacitor C4 and resistors R15 and R16, is a conventional audio oscillator circuit which provides a 2KHZ signal when actuated. The audio signal from oscillator 39 is supplied to gate 95 of tone driver 41. With the Q output of flip-flop 85 high gate 95 is inhibited, keeping an NPN transistor Q4 off so that no audio signal is provided to speaker 43.

Five seconds after the start of the 25 second interval, the five-second output of timer 15 goes momentarily high. However, the twenty-second output of timer 15 remains low and line 103 remains grounded. The five second output of timer 15 does not go high every 5 seconds, but rather at every 5-second interval between the 10-second intervals, i.e., at 5, 15, 25 seconds etc.

After ten seconds, a ten-second output of timer 15 goes high. This logic high is supplied via line 122 to the base of an NPN transistor Q5 for a period determined by the time constant of a capacitor C5 and resistors R17 and R18, turning transistor Q5 momentarily on and grounding the Q output of flip-flop 85. This makes one input to gate 95 low and an audio output of tone oscillator 39 is supplied to the base of transistor Q4 causing an audible signal or beep to be emitted by speaker 43. This audible signal, 15 seconds prior to the expiration of the predetermined timing interval, establishes the beginning of fixed period during which, for example, the person taking a patient's temperature may also take his pulse. When capacitor C5 charges to a sufficient level, transistor Q5 goes out of conduction, restoring the logic high input to gate 95 from flip-flop 85 and inhibiting tone driver 41.

After twenty seconds, the twenty-second output of timer 15 goes high and stays high, but the 5-second output of timer 15 stays low and line 103 remains grounded.

After 25 seconds, the 5-second output of timer 15 again goes high. With the 20-second output of timer 15 already high, a voltage spike is supplied via lines 103, 107 and 105 to the set input of flip-flop 83, triggering the flip-flop and making its Q output high and Q output low.

With the Q output of flip-flop 83 high, gates 97 and 99 both have high inputs causing their outputs to go low and taking transistors Q2 and Q3 out of conduction. This turns temperature processing light 37 off. Further, the logic high is supplied via line 102 to gate 79 of oscillator 13. This insures that oscillator 13 continues to supply pulses. A logic low from the Q output of flip-flop 83 takes transistor Q1 out of condition, removing the ground from the set input of flip-flop 85. Further, counter 91 and units counter 21 are no longer inhibited from responding to the pulses supplied by oscillator 13 through gate 17.

Each pulse now supplied to the clock input of counter 91 increments the contents of counter 91 from zero. The binary contents of counter 91 are supplied to a ladder network 123 on lines 125A through 125G. Ladder network 123 is an impedance network from which a voltage is derived whose amplitude is proportional to the contents of counter 91, all as is well known in the art. As the contents of counter 91 increase, the amplitude of the voltage supplied by network 123 to a second input of comparator 77 increases. Comparator 77 compares the amplitude of the voltage from amplifier 7, which is a function of the temperature sensed by probe 3, with the continually increasing amplitude of the voltage from ladder network 123.

As counter 91 increments its contents, unit counter 21 counts the pulses simultaneously supplied to it and counter 91 as elements of the digital signal from converter 11. Starting at zero, counter 21 increments its contents from zero through nine and then repeats the count cycle. Each time counter 21 attains a count of one, a logic high is supplied from counter 21 to tens counter 23. For each unit counted by counter 21, a logic high is supplied on a corresponding output line 127A through 127J to display driver 29. This logic high turns on an appropriate NPN transistor Q7A through Q7J in display driver 29 to provide a ground for all the light emitting diodes 27 in linear array 28 whose position in array 28 has a units value corresponding to that counted in counter 21. Thus, for example, if thirty-three signal elements are counted, a logic high is supplied on line 127C to turn on transistor Q7C. When this occurs, a ground is provided for the light emitting diodes 27 in array 28 positions 3, 13, 33, 43, 53 and 63.

Tens counter 23 responds to input signals from counter 21 to increment its contents from zero to six. For each tens digit counted by counter 23, a logic high is supplied on an output line 129A through 129G to display driver 31. This logic high turns on an appropriate NPN transistor Q8A through Q8G in driver 31 to provide a voltage path through that transistor to all light emitting diodes 27 in that decade of array 28. Thus, for example, when the first element of the electrical signal is counted by counter 21, a signal is supplied on line 127A to the count input of counter 23. Counter 23 supplies a logic high on line 129A to turn on transistor Q8A. This provides a voltage path to light emitting diodes 27 in array 28 positions 1 through 10. When counter 21 counts the eleventh element of the digital signal, counter 23 is again incremented and the logic output on line 129A goes low while that on 129B goes high. Transistor Q8B is turned on and a voltage path is provided to the light emitting diodes 27 in array 28 positions 11 through 20.

When the amplitude of the derived signal input to comparator 77 reaches that of the analog signal input to the comparator, the logic output of comparator 77 goes high and a terminate signal is provided on line 130 to the set input of flip-flop 85 triggering the flip-flop and making its Q output low. This logic low inhibits gate 17 and stops the supply of pulses from oscillator 13 to converter 11. Further, the input to gate 93 from flip-flop 85 goes low causing the output of gate 93 to go high whenever the one-second output of timer 15 is low. A logic high from gate 93 turns on an NPN transistor Q9 permitting voltage to be supplied through transistor Q9 and via line 132 through the appropriate transistor Q8 of display driver 31 to ten light emitting diodes 27 of linear array 28. Since a ground is provided through a transistor Q7 for one of these ten light emitting diodes 27, the voltage supplied through display drivers 33 and 31 illuminates only that diode. Thus if transistor Q7C in display driver 29 is on and the transistor Q8D in display driver 31 is on, light emitting diode 27 in array 28 position 33 is illuminated. Because the one-second output of timer 15 is only periodically low, voltage to the selected light emitting diode 27 is only intermittently supplied and this interrupt signal from timer 15 results in the selected diode flashing on and off. Illumination of the selected temperature indicator 27 now provides a single temperature read-out which the user may readily interpret to determine the patient's temperature. Further, less power is required to illuminate the selected diode 27 intermittently as opposed to continuously and this reduces drain on the batteries powering thermometer 1 and prolongs their useful life.

With the Q output of flip-flop 85 low, gate 95 of tone driver 41 is low and the output of tone oscillator 39 is supplied to transistor Q4 causing an audible tone to be produced by speaker 43. The user of thermometer 45 on hearing the tone is informed that the patient's temperature is being displayed and by noting which temperature indicator 27 is flashing on and off can read the temperature by reference to either Fahrenheit scale 71 or Centigrade scale 73. Further, the audible tone signifies the end of the 15 second period during which the person's pulse rate may be measured. By now multiplying by four the numbers of pulses counted, the person's pulse rate is determined. Once this is accomplished, placing of probe 3 back in receptacle 51 opens switch SW1 and removes power from temperature indicating apparatus 1.

If a patient's temperature is taken rectally, interface module 5 shown in FIG. 5B is used along with an appropriate temperature probe 3. In this configuration, jumper 113 connects line 109 to line 111 as before and the regulated voltage input to interface module 5 is connected to a line 131 which connects to the base of an NPN transistor Q6 through a resistor R19. Because lines 103 and 105 are not jumpered at interface module 5, flip-flop 83 is not set after 25 seconds have elapsed, but rather when the 40-second output of timer 15 goes high. The operation of temperature indicating apparatus 1 is the same as previously described except that when the 40 second predetermined timing interval has elapsed, the high at the 40 second output of timer 15 is supplied through a diode D3 to the set input of flip-flop 83 for a period determined by a capacitor C6 and resistors R20 and R21. This serves to trigger flip-flop 83 as before and initiates the conversion of the voltage representative of the temperature sensed by probe 3 to a digital signal and the illumination of one of the light emitting diodes 27 in linear array 28. Also, no audible tone or beep is provided fifteen seconds prior to completion of the 40 second interval because voltage is supplied through interface module 5, line 131 and resistor R19 to the base of transistor Q6, causing Q6 to conduct and grounding the base of transistor Q5 throughout the timing interval.

If a continuous temperature display is desired, interface module 5 shown in FIG. 5C is used along with an appropriate probe 3. In this configuration, the regulated voltage input to interface module 5 is connected to line 131 as before and also to tone control line 111. Further, line 109 from the one-second output of timer 15 is connected to time select line 105 and to a reset line 133 by a jumper 135. With voltage supplied on line 111 to inverter 115 of tone oscillator 39, the logic output of inverter 115 is low which inhibits gate 117 and the oscillator. As a result, no output signal is provided by tone oscillator 39.

In the continuous display mode of operation, oscillator 13 begins supplying timing pulses to counter 15 when the threshold temperature of 94° F. is sensed by probe 3. After one second, the one-second output of timer 15 goes momentarily high and is supplied on lines 109, 135 and 105 to the set input of flip-flop 83, triggering the flip-flop and initiating the conversion and temperature display operations previously described. With the pulse rate of oscillator 13 being approximately 205 Hz and with sixty-seven light-emitting diodes 27 in linear array 28, the time required to complete these operations is much less than one second. Thus, when the one-second output of timer 15 goes high at the end of the next second of timing, a temperature indicator 27 is illuminated.

The logic high on line 109 from timer 15 at the end of the next second of timing is supplied to the set input of flip-flop 83 as before but since flip-flop 83 is already set, this signal has no effect at that input. However, the logic high on line 109 is also supplied on lines 135 and 133 to the reset inputs of flip-flops 83 and 85 resetting both flip-flops. The illuminated temperature indicator 27 is extinguished because gate 93 has a low input from the Q output of flip-flop 85. Also, the logic high at the Q output of flip-flop 83 resets counters 91, 21 and 23 as previously discussed. On the next logic high from the one-second output of timer 15, flip-flop 83 is again set and a temperature indicator 27, indicative of the then current temperature in the region sensed by probe 3 is illuminated. Thus, changes in the temperature in the region may be tracked by following the sequence of temperature indicators 27 illuminated. Also, the temperature indicator 27 illuminated in this mode of operation does not flash on and off as previously described because the occurrence of the logic high at the one-second output of timer 15 which before caused this flashing effect now serves to cause the illuminated temperature indicator to be extinguished.

Power for temperature indicating apparatus 1 is supplied by a pair of batteries B1 and B2 (FIG. 4A) connected in parallel. The battery output voltage is supplied to a regulator circuit 137 which includes a zener diode D4 and an operational amplifier 139. Voltage developed across diode D4 is supplied to the non-inverting input of amplifier 139 through a voltage divider network consisting of resistors R22, R23 and R24. The voltage output of amplifier 139 is filtered by a capacitor C7 and fed back to the inverting input of the amplifier to provide the regulated voltage to the thermometer 1 circuitry.

A low voltage indicator circuit 141 consists of a pair of NPN transistors Q10 and Q11 and a biasing network comprised of resistors R25 through R29. Transistor Q10 is biased initially on and Q11 initially off. When the battery supply voltage falls below a preselected level, for example, 6.6 volts, transistor Q10 goes out of conduction causing transistor Q11 to turn on. Voltage is now supplied through transistor Q11 to the anode of low-voltage indicating LED 65 causing it to illuminate.

Finally, depressing display switch 75 completes a circuit through a lamp 143 (FIG. 4B) to illuminate scales 71 and 73 and permit reading of a temperature when thermometer 1 is used in a darkened room.

In view of the above, it will be seen that the several objects of the invention are achieved and other advantageous results attained.

As various changes could be made in the above constructions without departing from the scope of the invention, it is intended that all matter contained in the above description of shown in the accompanying drawings shall be interpreted as illustrative and not in a limiting sense.

What is claimed is:

1. Temperature indicating apparatus comprising:
   means for sensing the temperature in a region having a temperature to be measured;
   interface means responsive to the sensing means for supplying an analog signal whose amplitude is a function of the temperature in the region sensed by the sending means;
   means responsive to the analog signal for supplying a digital signal representative of the temperature in the region;
   display means for providing a visual indication of the temperature in the region, said means including a plurality of temperature indicators each of which represents a discrete temperature level;
   means responsive to the digital signal for selectively illuminating at any one time only that indicator which corresponds to the temperature represented by the digital signal at that time;
   means for supplying an intermittent signal to the signal responsive means whereby the temperature indicator selectively illuminated flashes on and off; and
   means for measuring a predetermined timing interval during which the temperature sensed by the sensing means approaches the temperature in the region, said predetermined timing interval being initiated in response to the sensing by the sensing means of a preselected temperature level;
   said digital signal supplying means being responsive to the measurement of the predetermined timing interval to supply said digital signal;
   said interface means being one of a group of precalibrated modules, each of which is adapted to be detachably connected to the digital signal means in order to permit removal and replacement of any one module by another module of that group.

2. Apparatus as set forth in claim 1 wherein the display means further includes means for supporting the temperature indicators, the temperature indicators being so positioned on the supporting means as to form a linear array.

3. Apparatus as set forth in claim 2 which further includes a faceplate for installation over the supporting means, said faceplate having positioned relative thereto first and second temperature scales, the first temperature scale providing a visual indication of the discrete temperature level represented by each temperature indicator in degrees Fahrenheit and the second temperature scale providing a visual indication of the discrete temperature level represented by each temperature indicator in degrees Centigrade.

4. Apparatus as set forth in claim 1 wherein the temperature indicators are light emitting diodes.

5. Apparatus as set forth in claim 1 further including audible indication means, and means for momentarily actuating the audible indication means at a predetermined period prior to the illumination of a selected temperature indicator whereby the audible indication means provides an audible tone signalling the commencement of a fixed time period during which medical information such as a person's pulse rate may be accurately ascertained.

6. Apparatus as set forth in claim 5 wherein the signal responsive means includes means for actuating the audible indication means to provide an intermittent audible tone concurrently with the selected temperature indicator in the display means being illuminated.

7. Apparatus as set forth in claim 1 wherein each module includes means for establishing a different unique predetermined timing interval which is thereby changed by replacing one interface module with another module.

UNITED STATES PATENT AND TRADEMARK OFFICE
CERTIFICATE OF CORRECTION

PATENT NO. : 4,121,462

DATED : October 24, 1978

INVENTOR(S) : Raymond R. Mohrman

It is certified that error appears in the above-identified patent and that said Letters Patent are hereby corrected as shown below:

At each of the following places, "Q" should read $--\overline{Q}--$: column 7, lines 6, 11, 16 and 23; column 8, lines 14, 29, 49 (second occurrence) and 57; column 9, line 53; column 10, line 12; column 11, lines 21 and 22. Column 8, line 58, "condition" should read --conduction--.

Signed and Sealed this

Thirteenth Day of March 1979

[SEAL]

Attest:

RUTH C. MASON
Attesting Officer

DONALD W. BANNER
Commissioner of Patents and Trademarks